United States Patent
Kim

(10) Patent No.: US 8,674,781 B2
(45) Date of Patent: Mar. 18, 2014

(54) PRINTED CIRCUIT BOARD COMPRISED OF AN INSULATING LAYER HAVING BURIED MICROSTRIP LINES AND CONDUCTORS WITH WIDTHS THAT NARROW INTO THE INSULATION LAYER

(75) Inventor: Heung-Kyu Kim, Cheongju-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/621,117

(22) Filed: Sep. 15, 2012

(65) Prior Publication Data

US 2013/0009729 A1 Jan. 10, 2013

Related U.S. Application Data

(62) Division of application No. 12/361,781, filed on Jan. 29, 2009, now Pat. No. 8,294,529.

(30) Foreign Application Priority Data

Sep. 4, 2008 (KR) ......................... 10-2008-0087265

(51) Int. Cl.
*H01P 3/08* (2006.01)

(52) U.S. Cl.
USPC ................................... 333/1; 333/5; 333/238

(58) Field of Classification Search
USPC .............................................. 333/1, 4, 5, 238
See application file for complete search history.

(56) References Cited

U.S. PATENT DOCUMENTS

| | | | |
|---|---|---|---|
| 2,721,312 A | 10/1955 | Greig et al. | |
| 6,624,729 B2 * | 9/2003 | Wright et al. | 333/238 |
| 7,151,420 B2 | 12/2006 | Brunker et al. | |
| 2002/0135444 A1 | 9/2002 | Ida et al. | |
| 2006/0071739 A1 * | 4/2006 | Hsu | 333/238 |
| 2009/0302976 A1 | 12/2009 | Cho | |

FOREIGN PATENT DOCUMENTS

| | | |
|---|---|---|
| JP | 04-267586 A | 9/1992 |
| JP | 06-314862 A | 11/1994 |
| JP | 11-298097 A | 10/1999 |
| JP | 2003-224408 A | 8/2003 |
| JP | 2008-034742 A | 2/2008 |
| KR | 10-0573494 | 4/2006 |
| KR | 2007-0065817 A | 6/2007 |

OTHER PUBLICATIONS

Korean Office Action w/ partial translation issued in Korean Patent Application No. KR 10-2008-0087265 dated Jun. 22, 2010.
Japanese Office Action, with partial translation, issued in Japanese Patent Application No. 2009-015336, dated Mar. 29, 2011.
Notice of Allowance issued in U.S. Appl. No. 13/621,122, dated Aug. 19, 2013.

\* cited by examiner

*Primary Examiner* — Benny Lee
(74) *Attorney, Agent, or Firm* — McDermott Will & Emery LLP

(57) ABSTRACT

A printed circuit board having a micro strip line, a printed circuit board having a strip line and a method of manufacturing thereof are disclosed. The printed circuit board having a micro strip line in accordance with an embodiment of the present invention includes a first insulation layer, a signal line buried in one surface of the first insulation layer, a plurality of conductors penetrating through the first insulation layer and being disposed on both sides of the signal line in parallel with the signal line, and a ground layer formed to be electrically connected to the conductor on the other surface of the first insulation layer.

4 Claims, 30 Drawing Sheets

PRINTED CIRCUIT BOARD COMPRISED OF AN INSULATING LAYER HAVING BURIED MICROSTRIP LINES AND CONDUCTORS WITH WIDTHS THAT NARROW INTO THE INSULATION LAYER

CROSS-REFERENCE TO RELATED APPLICATIONS

This application is a Divisional of U.S. application Ser. No. 12/361,781, filed Jan. 29, 2009, now U.S. Pat. No. 8,294,529, issued on Oct. 23, 2012, which claims the benefit of Korean Patent Application No. 10-2008-0087265, filed with the Korean Intellectual Property Office on Sep. 4, 2008, the disclosure of which is incorporated herein by reference in its entirety.

BACKGROUND

1. Technical Field

The present invention relates to a printed circuit board having a micro strip line, and a printed circuit board having a strip line and a method of manufacturing thereof.

2. Description of the Related Art

High performance of a digital device is increasing the frequency of the signal transmitted between semiconductor devices. Thus, a printed circuit board having a structure of a micro strip line or a strip line is now being used in order to transmit a high frequency signal.

FIG. 1 shows a printed circuit board 10 having a micro strip line according to a conventional technology. FIG. 2 shows a printed circuit board 20 having a strip line according to a conventional technology.

According to the conventional technology, as shown in FIG. 1, a signal line 13 is formed on one surface of an insulation layer 11 and a ground layer 12 is formed on the other surface of the insulation layer. Otherwise, as shown in FIG. 2, a power layer 24 is formed on one surface of the insulation layer 21 and the ground layer 22 is formed on the other surface of the insulation layer 21. A signal line 23 is also buried in the insulation layer 21 so that a digital signal is transmitted between semiconductor devices.

However, the conventional technology has a limited maximum bandwidth of a transmitted signal by causing cross talk between adjacent signal lines 13 in FIG. 1 and between adjacent signal lines 23 in FIG. 2, and signal transmission distortion, that is, noise due to signal dispersion.

SUMMARY OF THE INVENTION

The present invention provides a printed circuit board having a micro strip line and a printed circuit board having a strip line capable of reducing both cross talk between signal lines and signal dispersion, and a method of manufacturing thereof.

An aspect of the present invention features a printed circuit board having a micro strip line. The printed circuit board in accordance with an embodiment of the present invention can include: a first insulation layer; a signal line buried in one surface of the first insulation layer; a plurality of conductors penetrating through the first insulation layer and being disposed on both sides of the signal line in parallel with the signal line; and a ground layer formed to be electrically connected to the conductor on the other surface of the first insulation layer.

There are a plurality of the signal lines, and the signal line and the conductor can be alternately disposed.

The signal line can be constituted by a pair of unit signal lines, and the pair of unit signal lines can be a differential pair.

Each distance between the signal line and the conductors is identical to one another.

Meanwhile, a side of the signal line can face a side of the conductor in parallel.

Also, the width of the signal line can become narrower toward a farther surface of the insulation layer.

The printed circuit board can further include a second insulation layer formed on the ground layer, and a power layer formed on the second insulation layer.

Another aspect of the present invention features a method of manufacturing a printed circuit board having a micro strip line. The method in accordance with an embodiment of the present invention can include: forming a signal line on a carrier; burying the signal line in one surface of a first insulation layer by pressing the carrier onto the one surface of the first insulation layer; forming a plurality of conductors in the first insulation layer such that the conductors penetrate through the first insulation layer and are disposed on both sides of the signal line in parallel with the signal line; and forming a ground layer on the other surface of the first insulation layer such that the ground layer is electrically connected to the conductor.

Here, the forming of the conductor can include boring a through-hole in the first insulation layer, and filling the through-hole with a conductive material.

Also, after the forming of the ground layer, the method can further include forming a second insulation layer on the ground layer, and forming a power layer on the second insulation layer.

Yet another aspect of the present invention features a printed circuit board having a strip line. The printed circuit board in accordance with an embodiment of the present invention can include: a first insulation layer, a signal line being buried in one surface of the first insulation layer; a plurality of conductors penetrating through the first insulation layer and being disposed on both sides of the signal line in parallel with the signal line; a ground layer formed on the other surface of the insulation layer such that the ground layer is electrically connected to the conductor; a second insulation layer formed on one surface of the first insulation layer such that the second insulation layer covers the signal line; and a power layer formed on the second insulation layer.

In this case, there are a plurality of the signal lines, and the signal line and the conductor can be alternately disposed.

The signal line can be constituted by a pair of unit signal lines, and the pair of unit signal lines can be a differential pair.

Each distance between the signal line and the conductors can be identical to one another.

Meanwhile, a side of the signal line can face a side of the conductor in parallel.

The width of the signal line becomes narrower toward farther the other surface of the insulation layer.

Still another aspect of the present invention features a method of manufacturing a printed circuit board having a strip line. The printed circuit board in accordance with an embodiment of the present invention can include: forming a signal line on a carrier; burying the signal line in one surface of a first insulation layer by pressing the carrier onto the one surface of the first insulation layer; removing the carrier; forming a plurality of conductors on the first insulation layer such that the conductors penetrate through the first insulation layer and are disposed on both sides of the signal line in parallel with the signal line; forming a ground layer on the other surface of the first insulation layer such that the ground layer is electrically connected to the conductor; forming a second insulation layer on one surface of the first insulation layer such that the second insulation layer covers the signal line; and forming a power layer on the second insulation layer.

In this case, the forming of the conductor can further include boring a through-hole in the first insulation layer; and filling the through-hole with a conductive material.

DETAILED DESCRIPTION OF THE INVENTION

Figure 1:
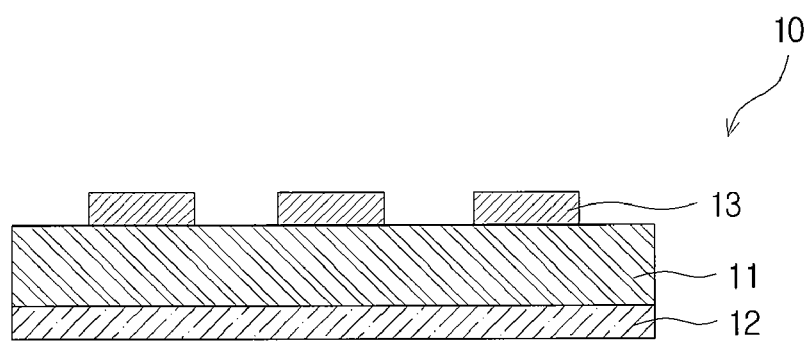
FIG. 1 is a cross sectional view showing a printed circuit board having a micro strip line according to a conventional technology.
Figure 2:
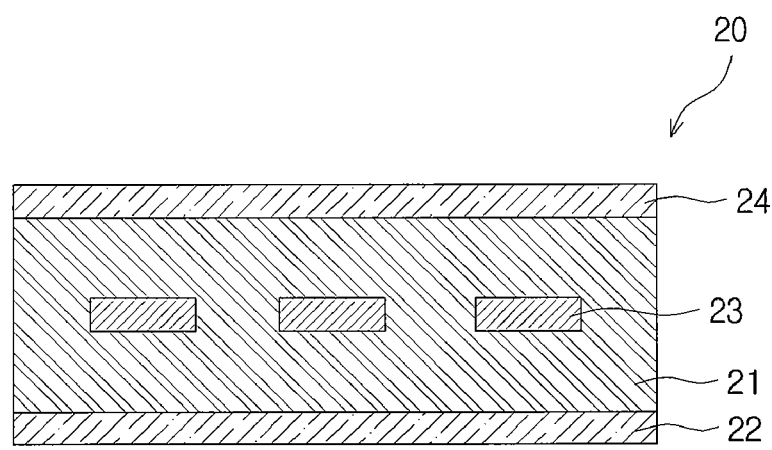
FIG. 2 is a cross sectional view showing a printed circuit board having a strip line according to a conventional technology.

A printed circuit board having a micro strip line according to the present invention, a printed circuit board having a strip line and a method of manufacturing thereof will be described in detail with reference to the accompanying drawings. In description with reference to the accompanying drawings, the same reference numerals will be assigned to the same or corresponding element, and repetitive description thereof will be omitted.

Figure 3:
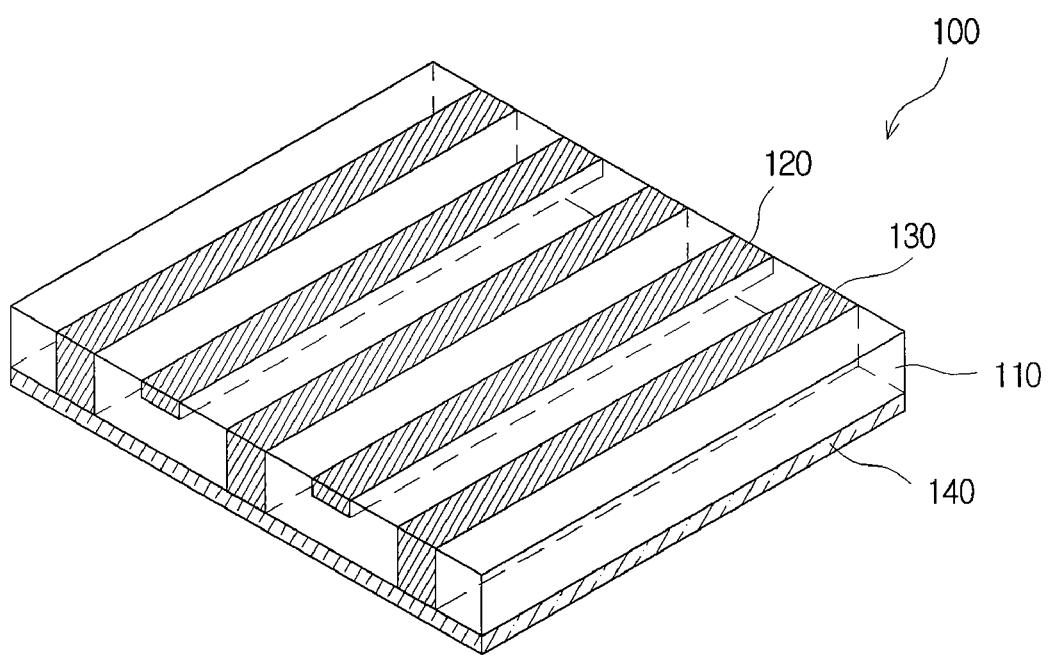
FIG. 3 is a perspective view showing an embodiment of a printed circuit board having a micro strip line according to an aspect of the present invention.
Figure 4:
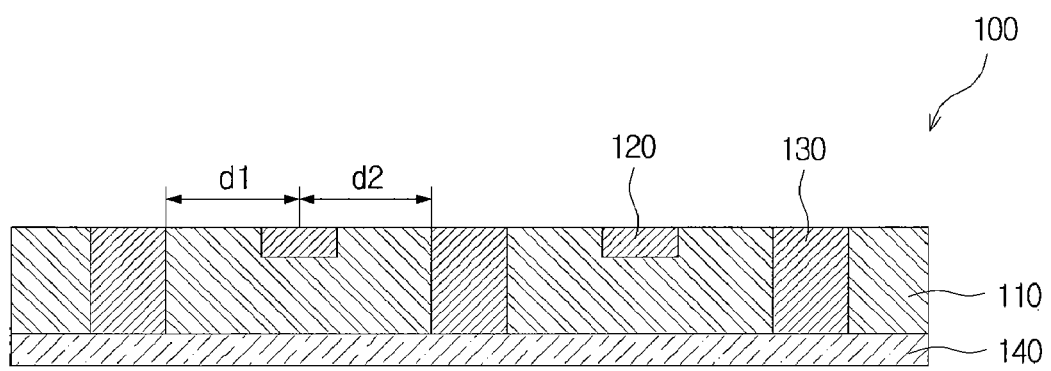
FIG. 4 is a cross sectional view showing an embodiment of a printed circuit board having a micro strip line according to an aspect of the present invention.

FIG. 3 is a perspective view showing an embodiment of a printed circuit board 100 having a micro strip line according to an aspect of the present invention. FIG. 4 is a cross sectional view showing an embodiment of a printed circuit board 100 having a micro strip line according to an aspect of the present invention.

According to the embodiment of the present invention, provided is a printed circuit board 100 having a micro strip line. The printed circuit board includes a first insulation layer 110, a signal line 120 buried in one surface of the first insulation layer 110, a plurality of conductors 130 penetrating through the first insulation layer 110 and being disposed on both sides of the signal line 120 in parallel with the signal line 120, and a ground layer 140 formed on the other surface of the first insulation layer 110 such that the ground layer is electrically connected to the conductor 130.

According to such an embodiment of the present invention, cross talk between adjacent signal lines 120 and digital signal distortion caused by inductance difference between a high frequency signal and a low frequency signal, that is, signal dispersion are reduced. Consequently, the transmission quality of a high-speed digital signal can be improved.

Hereinafter, structures of the embodiment of the present invention will be described in more detail with reference to FIGS. 3 to 8.

The micro strip line structure according to the embodiment of the present invention is constituted by the signal line 120, the ground layer 140, the first insulation layer 110 interposed between the signal line and the ground layer, and the conductor 130 disposed on both sides of the signal line 120.

The signal line 120 is buried in one surface of the first insulation layer 110 and a plurality of the signal lines can be formed at a predetermined interval. An alternating current flows through the signal line 120. Cross talk may be created by coupling capacitance formed between adjacent signal lines 120. Such a cross talk can be reduced by blocking the space between the signal lines 120 by means of the conductor 130 to be described below. This matter will be described in more detail in description of the conductor 130.

Additionally, the ground layer 140 is formed on the other surface of the first insulation layer 110 such that the ground layer is electrically connected to the conductor 130 to be described below. In this case, a part of the ground layer 140 can be used as a current path. This matter will be described in more detail in description of the conductor 130.

A plurality of the conductors 130 penetrate through the first insulation layer 110 and are disposed on both sides of the signal line 120 in parallel with the signal line 120. In other words, since the conductor 130 is formed to penetrate through one and the other surfaces of the first insulation layer 110 and since a pair of the conductors 130 disposed on both sides of the signal line 120 on the basis thereof is formed in parallel with the preceding direction of the current in the signal line 120, the signal line 120 is surrounded by both a pair of the conductors 130 disposed on both sides thereof and the ground layer 140.

Accordingly, with a minimal change of the current path in the ground layer 140 in accordance with the frequency change of the alternating current being transmitted to the ground layer 140, the distortion of digital signal transfer caused by the inductance difference between a high frequency signal and a low frequency signal, that is, signal dispersion can be reduced. This matter will be described in more detain in comparison with a conventional technology.

According to a conventional technology, due to both a skin effect, i.e., a phenomenon in which a high frequency current flows only around the surface of a conductor and a proximity effect, i.e., a phenomenon in which a high frequency current more concentrically flows through a part close to other conductor, the ground layer 140 has the current path of the high frequency current flow which becomes narrower than that of the low frequency current.

As a result, the high frequency current has a inductance lower than that of the low frequency current and the transfer speed of the alternating current changes according to the a frequency. Consequently, signal dispersion in which a digital signal being transmitted is distorted occurs.

However, according to the embodiment of the present invention, since the signal line 120 is surrounded by the conductor 130 and the ground layer 140, not only the ground layer 140 but also the side of the conductor 130 adjacent to the signal line 120 is used as the current path.

That is, the conductor 130 is formed at a distance similar to a distance from the signal line 120 to the ground layer 140, so that the side of the conductor 130 as well as the ground layer 140 can be used as a current path, when not only does the low frequency current flow, but also the high frequency current flows through the ground layer 140.

As such, with a minimal change of the current path according to the frequency, the dispersion mentioned above can be remarkably reduced.

Since a resistance can be minimized by using not only the ground layer 140 but also the side of the conductor 130 as a current path in the high frequency, the quality of the digital signal being transmitted can be improved.

Here, as shown in FIG. 4, each distance d1 and d2 between the signal line 120 and the conductors is identical to one another. Therefore, the current path mentioned above is symmetrical, so that noise can be reduced. Consequently, the quality of the digital signal being transmitted can be improved.

Meanwhile, there are a plurality of the signal lines 120. The signal line 120 and the conductor 130 are alternately disposed. Because the conductor 130 performs a function of an obstruction, cross talk between the adjacent signal lines 120 can be reduced.

That is, the signal line 120 is completely buried in the first insulation layer 110. The conductor 130 penetrates through the first insulation layer 110 and is formed across both surfaces of the first insulation layer 110. Finally, the adjacent signal lines 120 are entirely blocked by the conductor 130.

With respect to the adjacent signal lines 120, cross talk is created by coupling capacitance generated between the adjacent signal lines, so that noise may occur in the digital signal being transmitted. In order to prevent said problem, in the embodiment of the present invention, a capacitance is prevented from being formed between the adjacent lines 120 by disposing the conductor 130 which blocks the space between a plurality of the signal lines 120. Accordingly, cross talk caused by the capacitor can be notably reduced.

Next, a transformed shape of the embodiment of the present invention will be described with reference to FIGS. 5 to 8 focusing on a difference from the description above.

FIGS. 5 to 8 are cross sectional views showing transformed shapes of a printed circuit board 100 having a micro strip line according to an aspect of the present invention.

Figure 5:
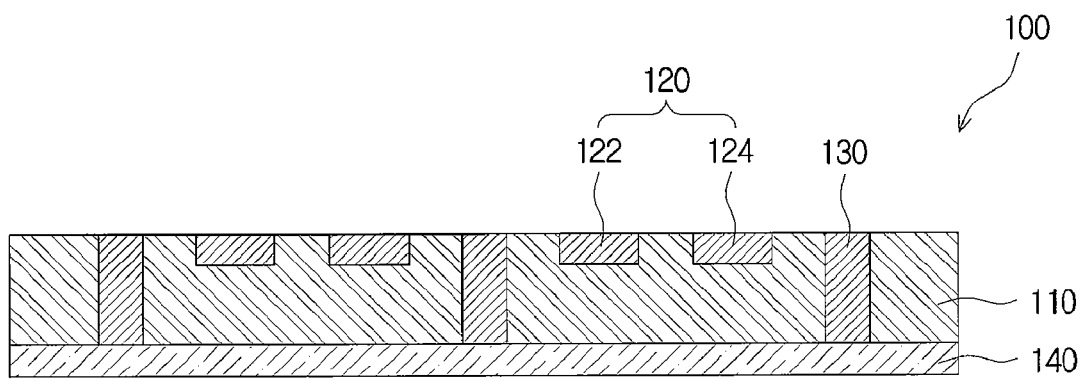
FIGS. 5 to 8 are cross sectional views showing transformed shapes of a printed circuit board having a micro strip line according to an aspect of the present invention.

In FIG. 5, a signal line 120 can be constituted by a pair of unit signal lines 122 and 124. Such unit signal lines 122 and 124 can be a differential pair. As a result, even though an alternating current transmitted to one unit signal line 122 is changed due to noise, the other unit signal line 124 compensates for the change due to noise. Eventually, the quality of the digital signal being transmitted can be improved.

Figure 6:
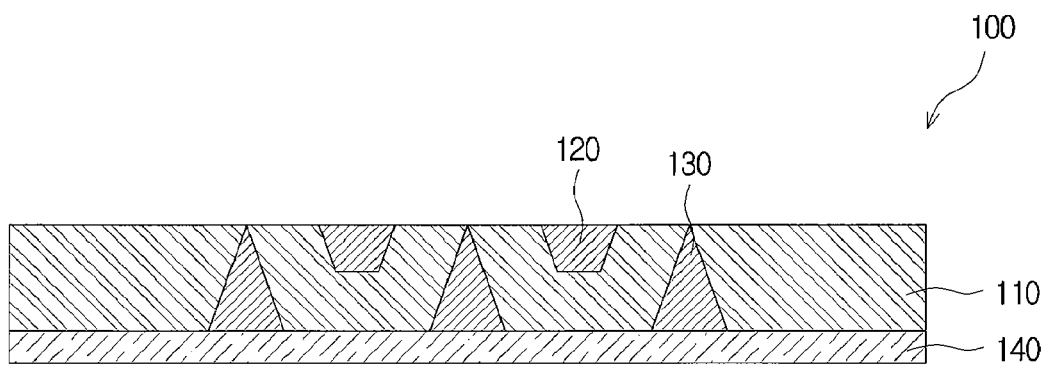

Besides, in FIG. 6, the side of the signal line 120 faces the side of the conductor 130 in parallel. The width of the signal line 120 becomes narrower toward the other surface of the insulation layer, such that the cross-section of the signal line 120 can have a trapezoidal shape. As the side of the signal line 120 faces the side of the conductor 130 in parallel, a certain distance between the signal line and the conductor can be maintained. Accordingly, the occurrence of noise can be reduced and a high-quality digital signal can be more efficiently transmitted.

As shown in FIG. 6, the side of the signal line 120 faces the side of the conductor 130 in parallel as well as the width of the lower part of the signal line 120 is narrower than that of the upper part of the signal line. Thus, a distance from each point of the surface of the signal line 120 to both the ground layer 140 and the conductor 130 can be relatively and uniformly maintained. Accordingly, the occurrence of noise can be reduced and a digital signal can be more efficiently transmitted.

In this case, as shown in FIG. 6, the width of the conductor 130 becomes narrower toward the upper part from the lower part. As a result, since one surface of the first insulation layer 110 has an increasing space, the degree of density of the signal line 120 buried in one surface of the first insulation layer 110 can be increased.

Figure 7:
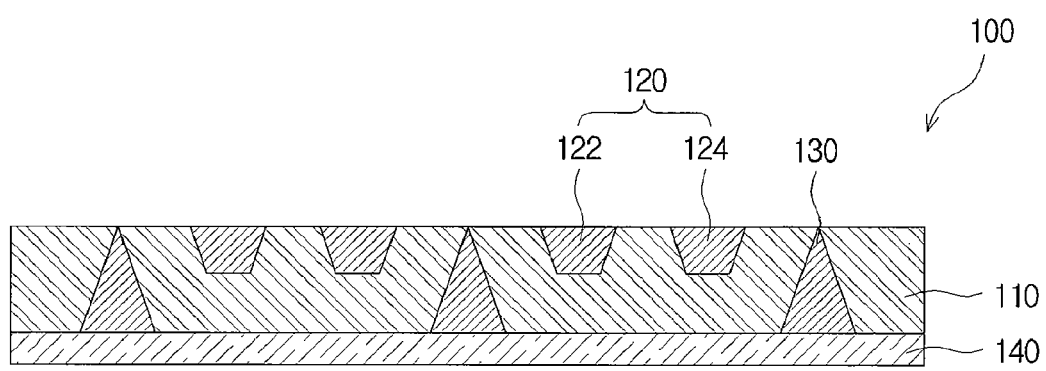

In FIG. 7, shown are a signal line 120 having a trapezoidal cross-section and unit signal lines 122 and 124 being a differential pair. The detailed description thereof will be omitted.

Figure 8:
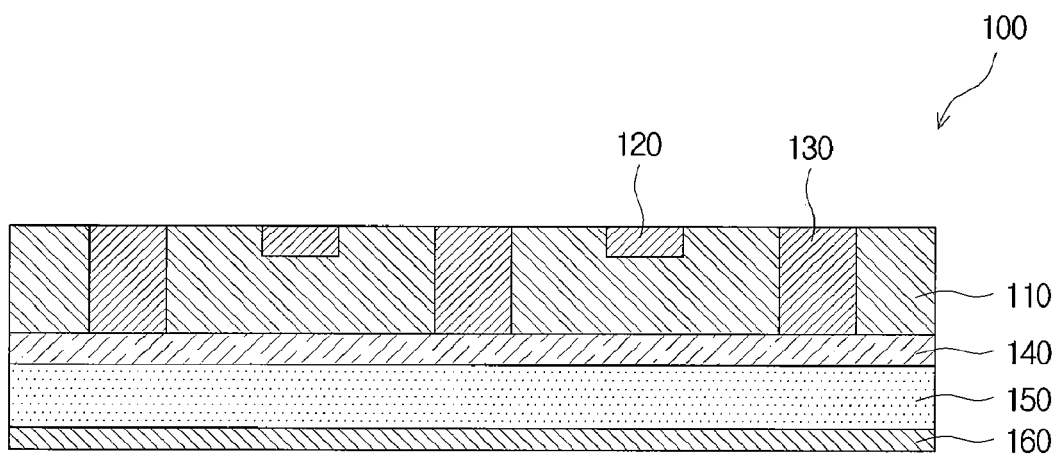

As shown in FIG. 8, the printed circuit board 100 according to the embodiment of the present invention can further include a second insulation layer 150 formed on the ground layer 140 and a power layer 160 formed on the second insulation layer 150.

Next, an embodiment of a method of manufacturing a printed circuit board 200 having a micro strip line according to another aspect of the present invention will be described.

Figure 9:
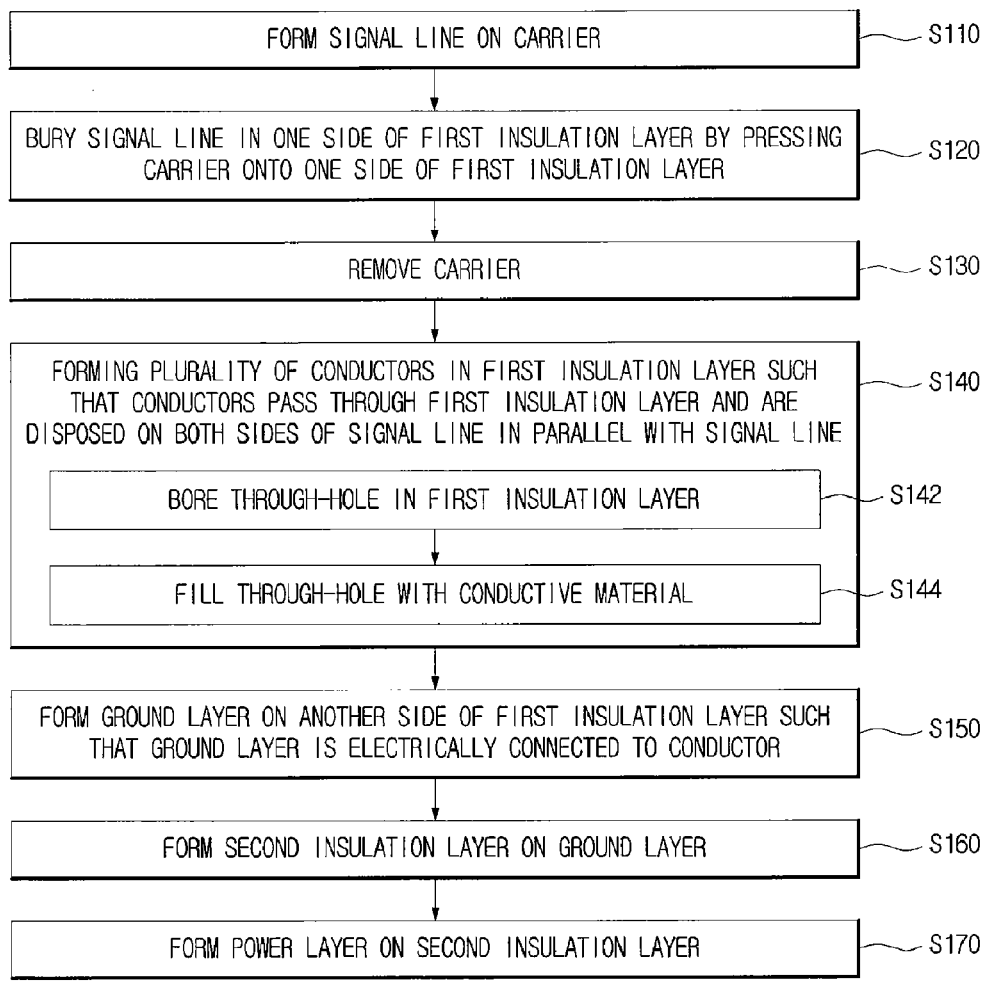
FIG. 9 is a flowchart showing an embodiment of a method of manufacturing a printed circuit board having a micro strip line according to another aspect of the present invention.

FIG. 9 is a flowchart showing an embodiment of a method of manufacturing a printed circuit board having a micro strip line according to another aspect of the present invention. FIGS. 10 to 17 are cross sectional views showing processes of an embodiment of a method of manufacturing a printed circuit board having a micro strip line according to another aspect of the present invention.

According to the embodiment of the present invention, provided is a method of manufacturing a printed circuit board 200 having a micro strip line. The method includes forming a signal line 220 on a carrier 205 (see FIG. 10), burying the signal line 220 in one surface of a first insulation layer 210 by pressing the carrier 205 onto the one surface of the first insulation layer 210 (see FIG. 11), forming a plurality of conductors 230 in the first insulation layer 210 such that the conductors penetrate through the first insulation layer 210 and are disposed on both sides of the signal line 220 in parallel with the signal line 220 (see FIG. 14), and forming a ground layer 240 on the other surface of the first insulation layer 210 such that the ground layer is electrically connected to the conductor 230 (see FIG. 15).

According to such an embodiment of the present invention, it is possible to implement the printed circuit board 200 reducing cross talk between adjacent signal lines 220 and digital signal distortion caused by inductance difference between a high frequency signal and a low frequency signal, that is, signal dispersion.

Hereinafter, each process will be described in detail with reference to FIGS. 9 to 17.

Figure 10:
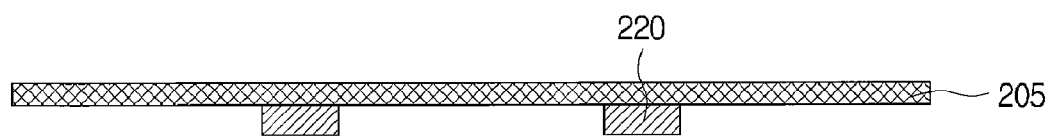
FIGS. 10 to 17 are cross sectional views showing processes of an embodiment of a method of manufacturing a printed circuit board having a micro strip line according to another aspect of the present invention.

First, as shown in FIG. 10, the signal line 220 is formed on the carrier 205 (S110 in FIG. 9). For example, the signal line 220 is formed on the carrier 205 by using electrolytic plating. In addition, the signal line 220 can be also formed by using various processes such as a subtractive process, an inkjet process and the like.

Figure 11:
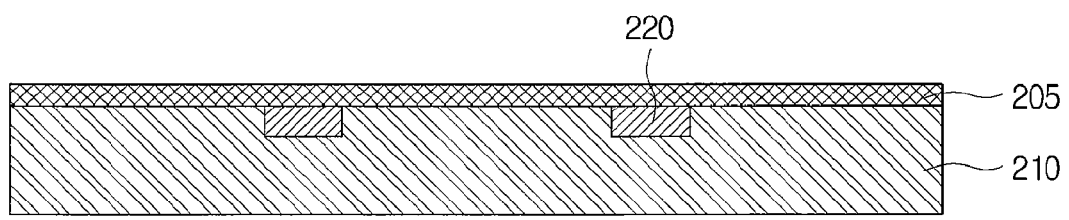

Subsequently, as shown in FIG. 11, the signal line 222 is buried in one surface of the first insulation layer 210 by pressing the carrier 205 onto the one surface of the first insulation layer 210 (S120 in FIG. 9). This is a process of heating and compressing the carrier 205 and the first insulation layer 210 in order to bury the signal line 220 in one surface of the first insulation layer 210. By using the carrier 205 mentioned above, it is possible to more easily bury the signal line 220 in the first insulation layer 210 and to enhance the adhesive strength between the signal line 220 and the first insulation layer 210.

Figure 12:
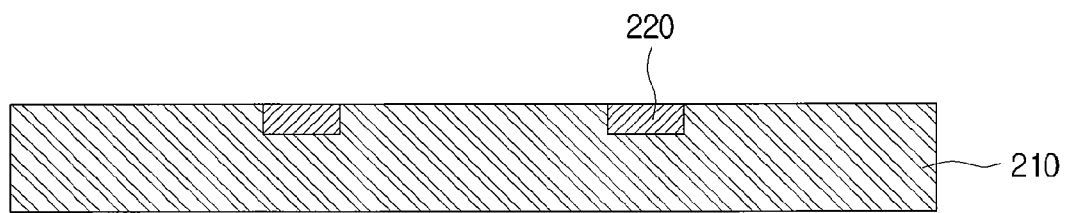

As shown in FIG. 12, the carrier 205 (e.g. see FIG. 11) is removed from the one surface of the first insulation layer 210 (S130 in FIG. 9). This is a process of exposing the signal line 220 to the outside of the printed circuit board. The signal line 220 can be exposed by separating the carrier 205 or by etching and removing the carrier 205.

Figure 13:
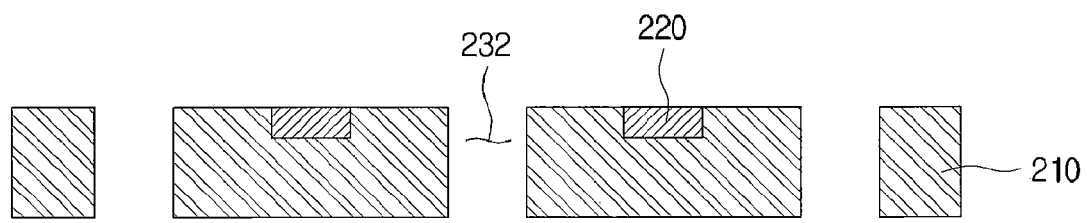
Figure 14:
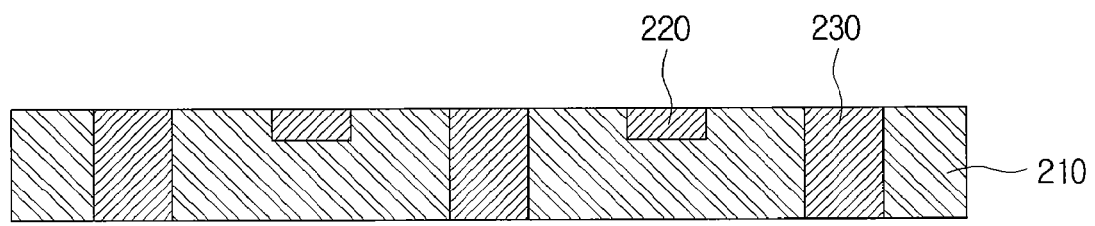

As shown FIGS. 13 and 14, a plurality of the conductors 230 (see FIG. 14) are formed in the first insulation layer 210 such that the conductors penetrate through the first insulation layer 210 and are disposed on both sides of the signal line 220 (see FIG. 14) in parallel with the signal line 220 (S140 in FIG. 9). Here, the conductors 230 are disposed on both sides of the signal line 220 and are extended in parallel with the current proceeding direction of the signal line 220, so that the conductor surrounds the signal line 220 together with the ground layer 240. The conductor 230 is disposed in the space between a plurality of the signal lines 220 and blocks the space between the signal lines 220. As a result, the conductor 230 can reduce the signal dispersion and cross talk. As the one embodiment mentioned above has described the subject, the more detailed description thereof will be omitted.

The process of forming the conductor 230 mentioned above can be described as below stage by stage.

First, as shown in FIG. 13, a through-hole 232 is bored in the first insulation layer 210 (S142 in FIG. 9). In other words, the through-hole 232 is bored in the first insulation layer 210 such that the signal line 220 can be disposed between the conductors 230 (see FIG. 14). Subsequently, as shown in FIG. 14, the through-hole 232 (see FIG. 13) is filled with a conductive material (S144 in FIG. 9). For example, the through-hole can be filled by plating the inside of the through-hole 232 or by filling the inside of the through-hole 232 with a conductive paste.

Figure 15:
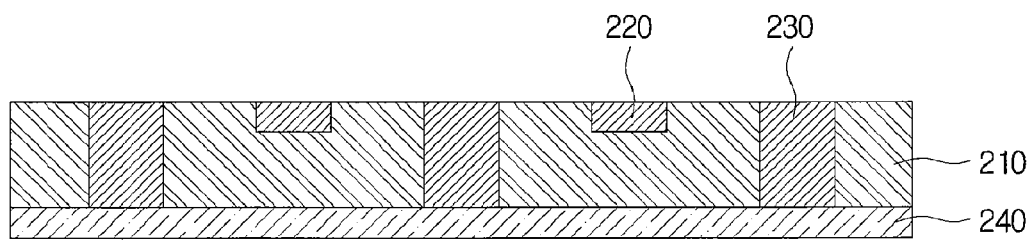

As shown in FIG. 15, the ground layer 240 is formed on the other surface of the first insulation layer 210 such that the ground layer is electrically connected to the conductor 230 (S150 in FIG. 9). For example, the ground layer can be formed by plating the other surface of the first insulation layer 210 or by laminating copper foil on the other surface of the first insulation layer.

In such a ground layer 240, a part of the ground layer is used as a current path. The conductor 230 mentioned above is electrically connected to the ground layer 240 so that the conductor as well as the ground layer 240 can be also used as a current path.

Figure 16:
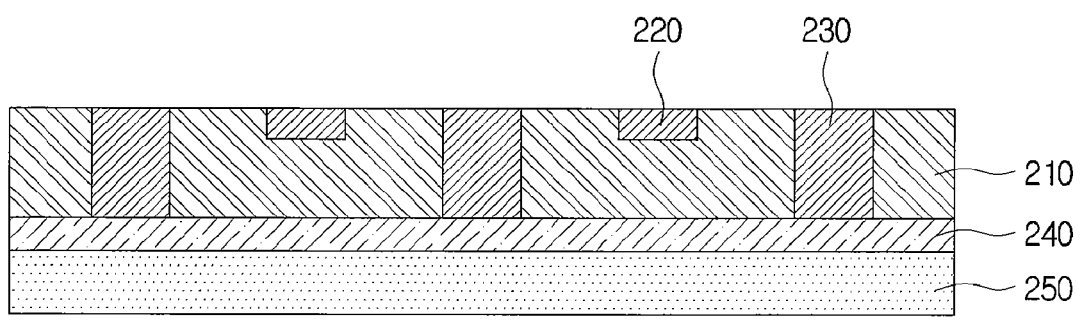

As shown in FIG. 16, a second insulation layer 250 is formed on the ground layer 240 (S160 in FIG. 9). This is a process of forming the second insulation layer 250 on the ground layer 240 which has been formed in the previous process. For example, the process can be performed by laminating the second insulation layer 250 on the ground layer 240.

Figure 17:
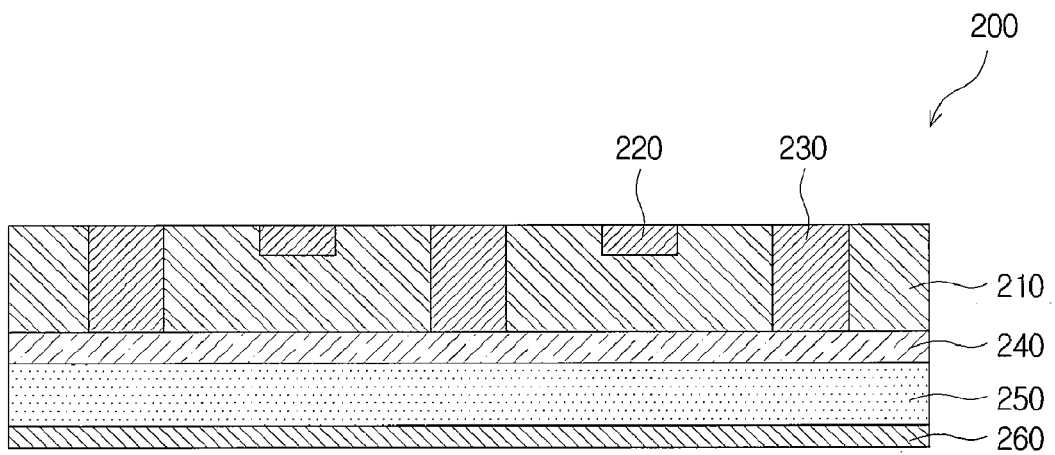

As shown in FIG. 17, a power layer 260 is formed on the second insulation layer 250 (S170 in FIG. 9). This is a process of forming the power layer 260. For example, the power layer 260 can be formed by plating the other surface of the second insulation layer 250 or by laminating copper foil on the second insulation layer 250.

In the embodiment of the present invention, it has been provided as an example that a method of performing a process S140 (in FIG. 9) of forming a plurality of the conductors 230 in the first insulation layer 210 after performing the process S120 (in FIG. 9) of burying the signal line 220 on one surface of the first insulation layer 210. However, on the contrary, the process S120 (in FIG. 9) of burying the signal line 220 can be performed after performing the process S140 (in FIG. 9) of forming a plurality of the conductors 230, which also belongs to the scope of rights of the present invention.

In the mean time, as shown in FIGS. 3 to 7, it is possible to manufacture a printed circuit board (see reference numeral 100 in FIGS. 3 to 7) having various types of micro strip lines. Since a process of manufacturing the printed circuit board is the same as or similar to that of the embodiment of the present invention, descriptions thereof will be omitted.

Next, an embodiment of a printed circuit board 300 having a strip line according to yet another aspect of the present invention will be described.

Figure 18:
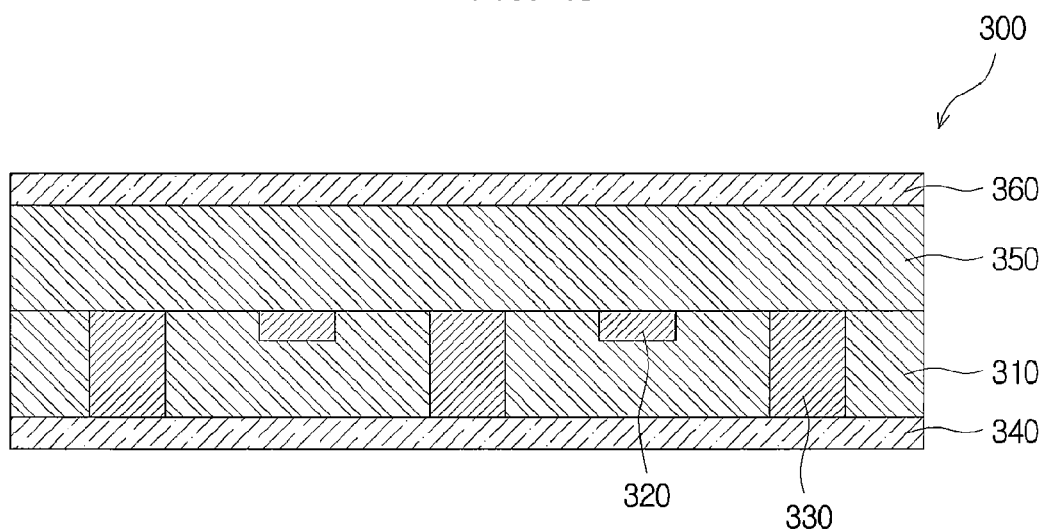
FIG. 18 is a cross sectional view showing an embodiment of a printed circuit board having a strip line according to yet another aspect of the present invention.
Figure 19:
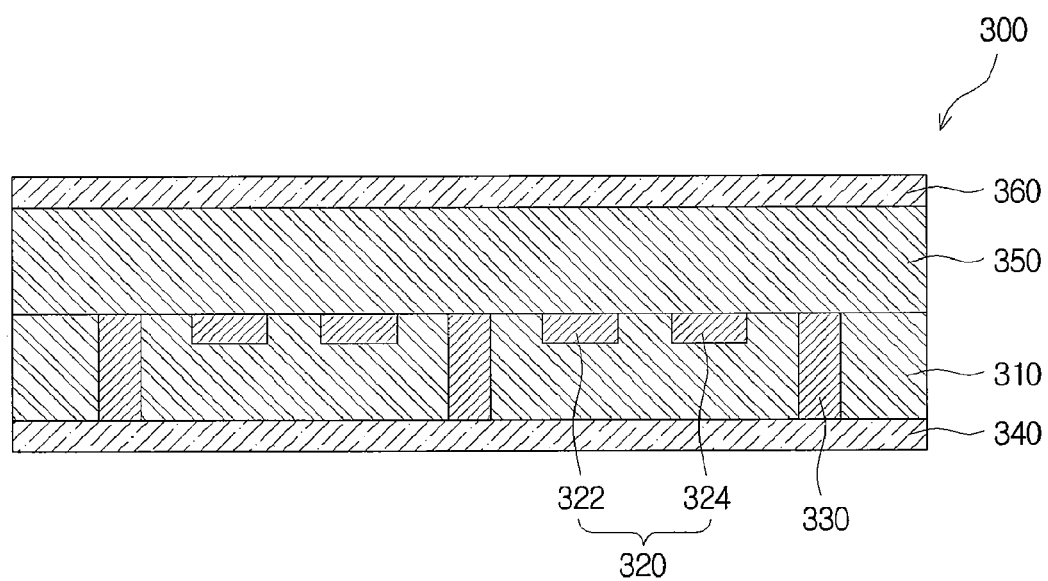
FIGS. 19 to 21 are cross sectional views showing transformed shapes of an embodiment of a printed circuit board having a strip line according to yet another aspect of the present invention
Figure 20:
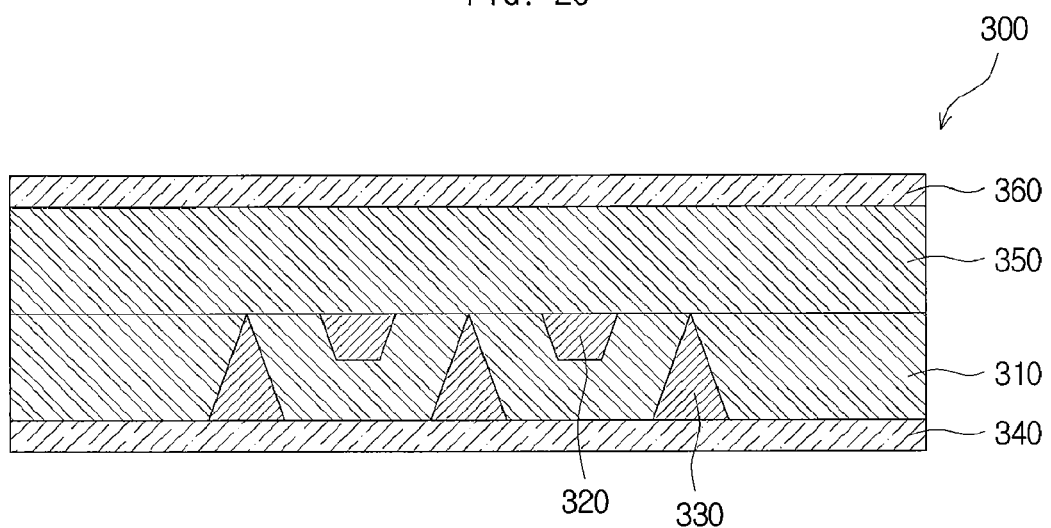
Figure 21:
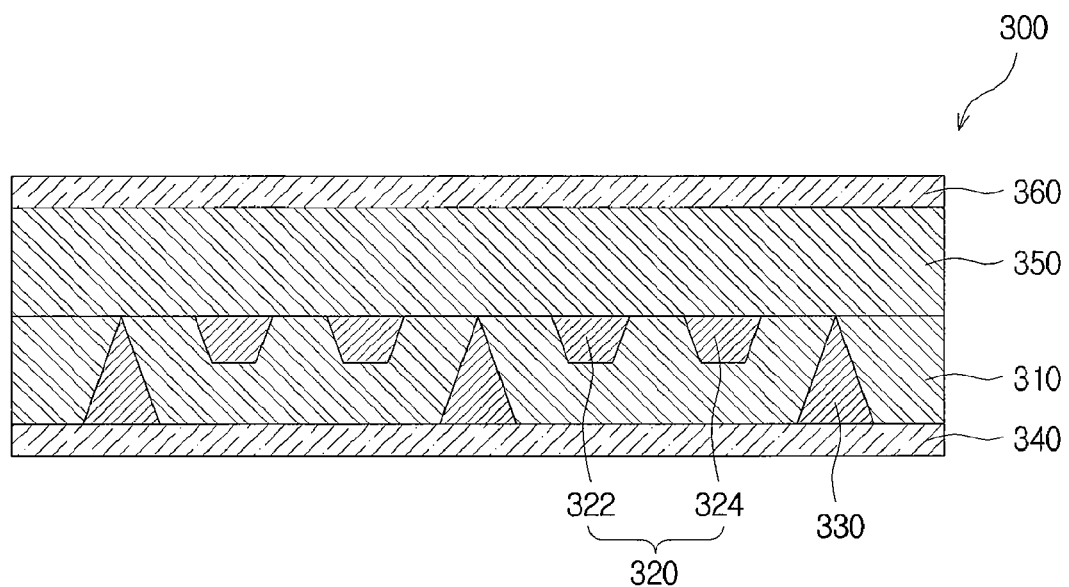

FIG. 18 is a cross sectional view showing an embodiment of a printed circuit board 300 having a strip line according to yet another aspect of the present invention. FIGS. 19 to 21 are cross sectional views showing transformed shapes of an embodiment of a printed circuit board 300 having a strip line according to yet another aspect of the present invention According to the embodiment of the present invention, as shown in FIG. 18, provided is a printed circuit board 300 having a strip line. The printed circuit board includes a first insulation layer 310, a signal line 320 buried in one surface of the first insulation layer 310, a plurality of conductors 330 penetrating through the first insulation layer 310 and being disposed on both sides of the signal line 320 in parallel with the signal line 320, a ground layer 340 formed on the other surface of the first insulation layer 310 such that the ground layer is electrically connected to the conductor 330, a second insulation layer 350 formed on one surface of the first insulation layer 310 such that the second insulation layer covers the signal line 320, and a power layer 360 formed on the second insulation layer 350.

According to such an embodiment of the present invention, cross talk between adjacent signal lines 120 and digital signal distortion caused by inductance difference between a high frequency signal and a low frequency signal, that is, signal dispersion are reduced. Consequently, the transmission quality of a high-speed digital signal can be improved.

In the embodiment of the present invention, since the configuration and consequent functions of the first insulation layer 310, the signal lines 322 and 324 collectively referred to as a signal line 320, the conductor 330 and the ground layer 340 have been described in the one embodiment of the printed circuit board (see reference numeral 100 in FIGS. 3 to 7) having the micro strip line described above, descriptions thereof will be omitted. Hereinafter, a difference from the embodiment of the present invention, that is, the second insulation layer 350 and the power layer 360 will be described.

The second insulation layer 350 is formed on one surface of the first insulation layer 310 such that the second insulation layer covers the signal line 320. The power layer 360 is formed on such a second insulation layer 350. Therefore, it is possible to form a strip line structure having the signal line 320 buried between the first insulation layer 310 and the second insulation layer 350, the ground layer 340 formed on the other surface of the first insulation layer 310, and the power layer 360 formed on the second insulation layer 350.

Next, an embodiment of a method of manufacturing a printed circuit board 400 having a strip line according to still another aspect of the present invention will be described.

Figure 22:
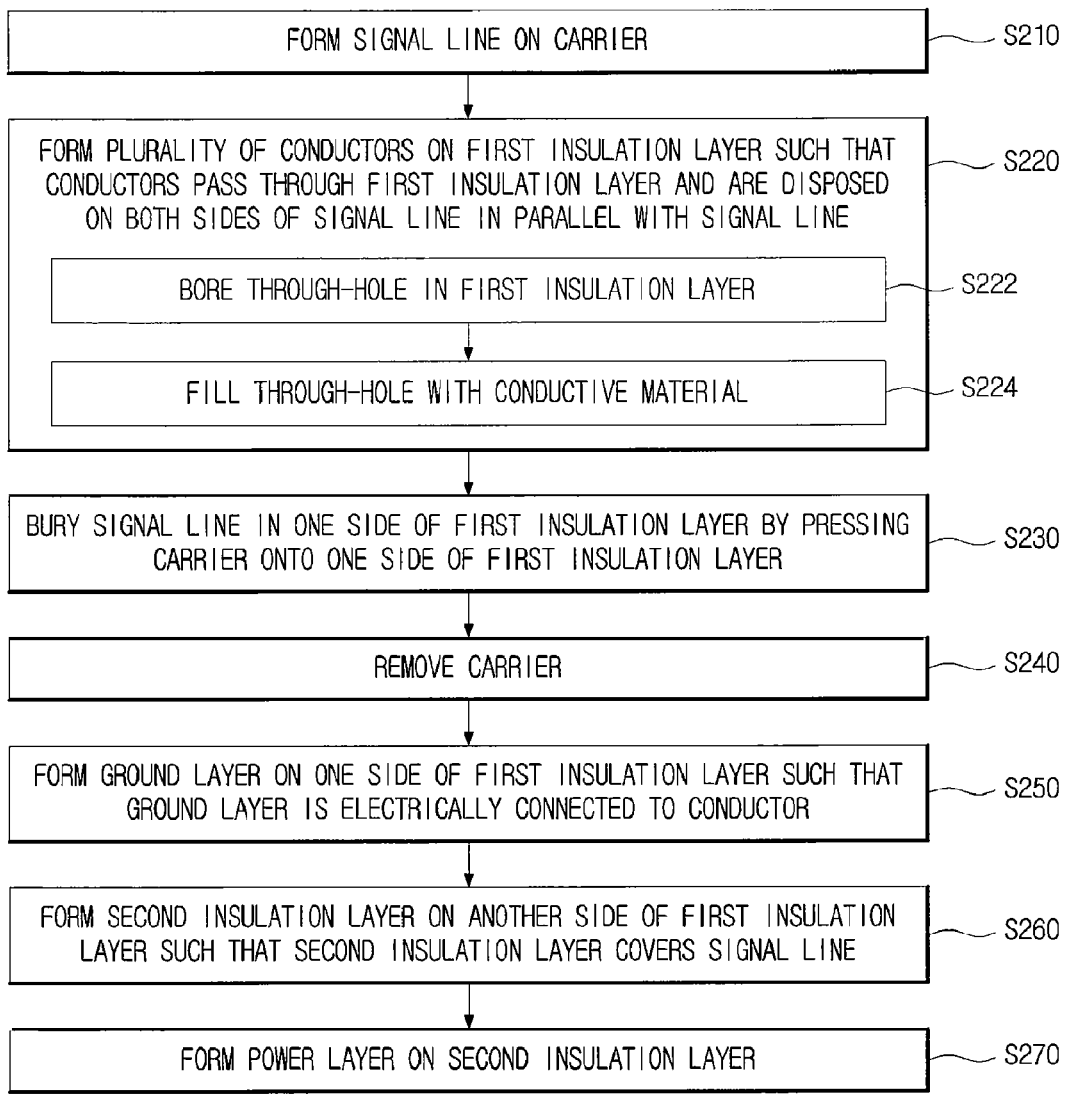
FIG. 22 is a flowchart showing an embodiment of a method of manufacturing a printed circuit board having a strip line according to still another aspect of the present invention.

FIG. 22 is a flowchart showing an embodiment of a method of manufacturing a printed circuit board having a strip line according to still another aspect of the present invention.

FIGS. 23 to 30 are cross sectional views showing processes of an embodiment of a method of manufacturing a printed circuit board having a strip line according to still another aspect of the present invention.

According to the embodiment of the present invention, provided is a method of manufacturing a printed circuit board 400 (see FIG. 30) having a strip line. The method includes forming a signal line 420 on a carrier 405 (see FIG. 23), forming a plurality of conductors 430 (see FIG. 25) on a first insulation layer 410 (see FIG. 24) such that the conductors penetrate through the first insulation layer 410 and are disposed on both sides of the signal line 420 in parallel with the signal line 420, burying the signal line 420 in one surface of a first insulation layer 410 by pressing the carrier 405 onto the one surface of the first insulation layer 410 as shown in FIG. 26, removing the carrier 405 as shown in FIG. 27, forming a ground layer 440 on the other surface of the first insulation layer 410 such that the ground layer is electrically connected to the conductor 430 as shown in FIG. 28, forming a second insulation layer 450 on one surface of the first insulation layer 410 such that the second insulation layer covers the signal line 420 as shown in FIG. 29, and forming a power layer 460 on the second insulation layer 450 as shown in FIG. 30.

According to such an embodiment of the present invention, it is possible to implement the printed circuit board 400 reducing cross talk between adjacent signal lines 420 and digital signal distortion caused by inductance difference between a high frequency signal and a low frequency signal, that is, signal dispersion.

Figure 23:
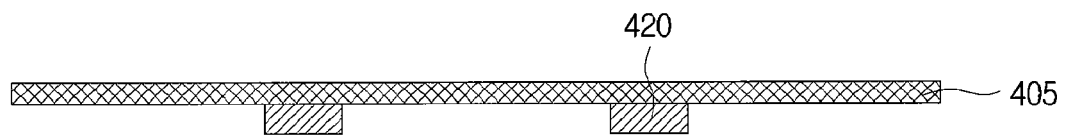
FIGS. 23 to 30 are cross sectional views showing processes of an embodiment of a method of manufacturing a printed circuit board having a strip line according to still another aspect of the present invention.
Figure 24:
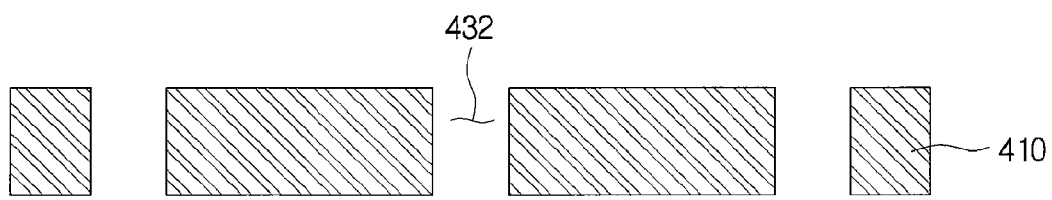
Figure 25:
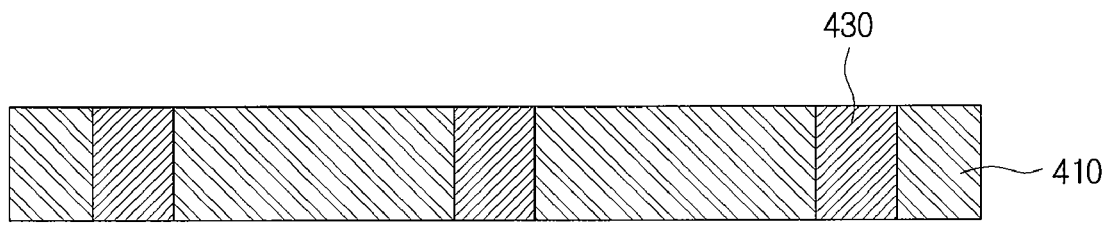
Figure 26:
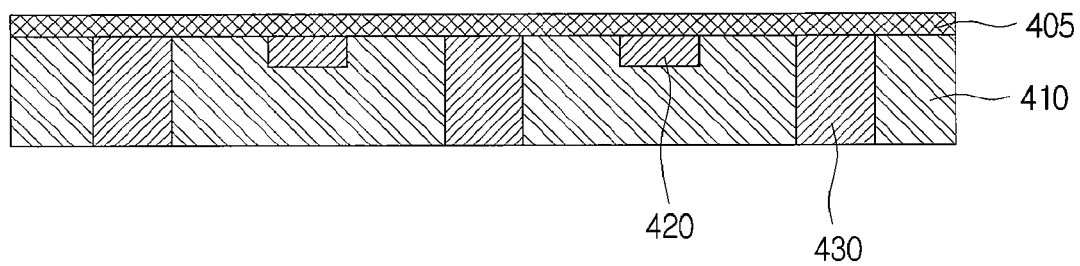
Figure 27:
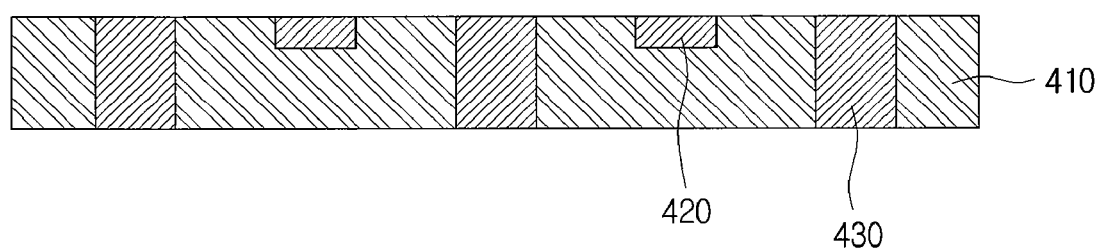
Figure 28:
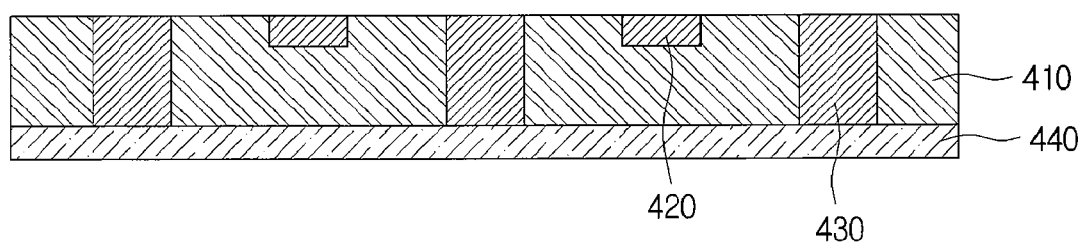

In the embodiment of the present invention, since the one embodiment of the method of manufacturing the printed circuit board 400 (see reference numeral 200 of FIG. 17) having the strip line mentioned above has described the process S210 (in FIG. 22) of forming the signal line 420 on the carrier 405 as shown in FIG. 23, the process S220 (in FIG. 22) of forming a plurality of conductors 430 in the first insulation layer 410 by boring a through-hole 432 in the first insulation layer 410 (S222 in FIG. 22) as shown in FIG. 24 and by filling the through-hole 432 (in FIG. 24) with the conductors 430 of a conductive material (S224 in FIG. 22) as shown in FIG. 25, the process S230 (in FIG. 22) of burying the signal line 420 in one surface of the first insulation layer 410 as shown in FIG. 26, the process S240 (in FIG. 22) of removing the carrier 405 (in FIG. 26) from the one surface of the first insulation layer 410 as shown in FIG. 27, and the process S250 (in FIG. 22) of forming the ground layer 440 on the other surface of the first insulation layer 410 as shown in FIG. 28, descriptions thereof will be omitted. Hereinafter, differences from the embodiment of the present invention, that is, a process S260 (in FIG. 22) of forming the second insulation layer 450 and a process S270 (in FIG. 22) of forming the power layer 460 will be described.

Figure 29:
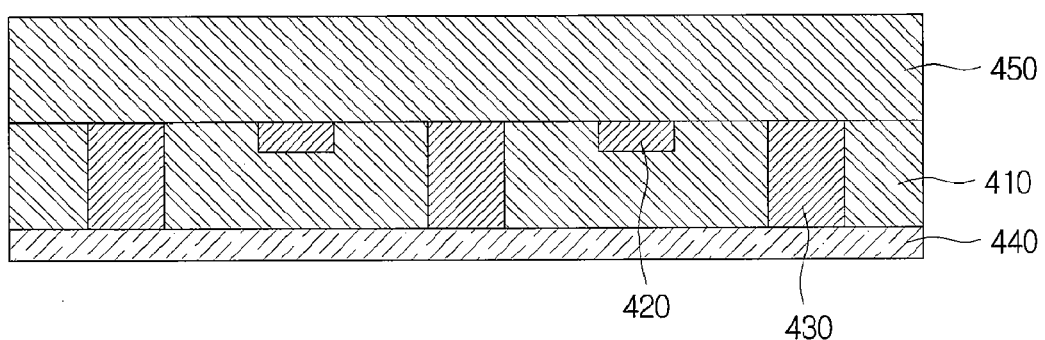
Figure 30:
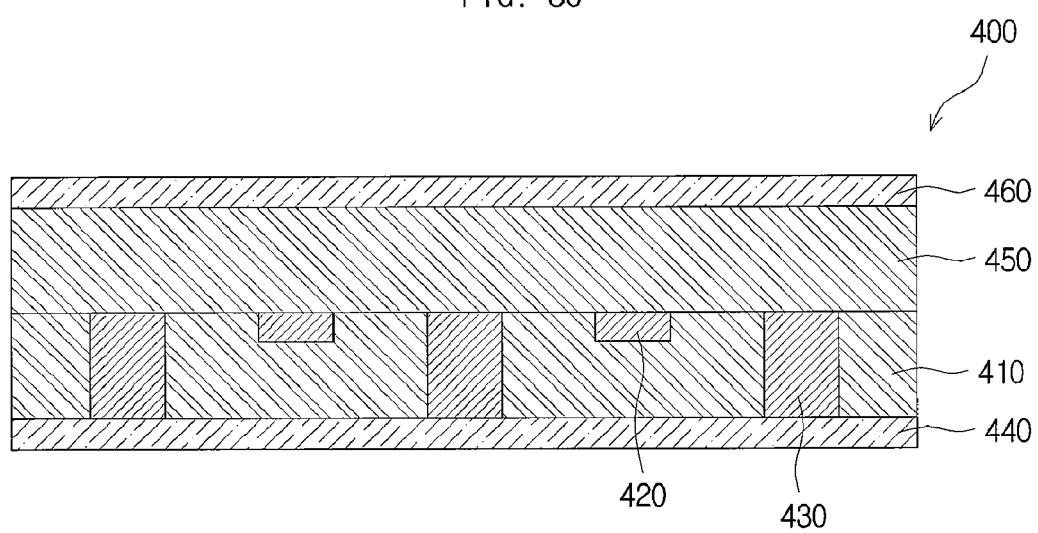

After forming the ground layer 440, as shown in FIG. 29, the second insulation layer 450 is formed on one surface of the first insulation layer 410 such that the second insulation layer covers the signal line 420 (S260 in FIG. 22). This is a process of forming the second insulation layer 450 to cover the signal line 420 in order to completely bury the signal line 420. For example, the process can be performed by laminating a semi-cured second insulation layer 450 on one surface of the first insulation layer 410.

Next, as shown in FIG. 30, the power layer 460 is formed on the second insulation layer 450 (S270 in FIG. 22). This is a process of completing a strip line structure by forming the power layer 460 on the second insulation layer 450. For example, the power layer 460 can be formed by plating the second insulation layer 450 or by laminating copper foil on the second insulation layer 450.

In the embodiment of the present invention, it has been provided as an example that a method of performing a process S230 (in FIG. 22) of burying the signal line 420 on one surface of the first insulation layer 410 after performing a process S220 (in FIG. 22) of forming a plurality of the conductors 430 on the first insulation layer 410. However, on the contrary, the process S220 (in FIG. 22) of forming a plurality of the conductors 430 can be performed after the process S230 (of FIG. 22) of burying the signal line 420, which also belongs to the scope of rights of the present invention.

In the mean time, as shown in FIGS. 19 to 21, it is possible to manufacture a printed circuit board (see reference numeral 300 in FIGS. 19 to 21) having various types of micro strip lines. Since a process of manufacturing the printed circuit board is the same as or similar to that of the embodiment of the present invention, descriptions thereof will be omitted.

While the one embodiment of the present invention has been described, it is possible for those skilled in the art to make various changes and modifications of the forms and details of the present invention by means of addition, change, elimination or supplement, etc., of the components of the present invention without departing from the spirit of the present invention as defined by the appended claims, which also belongs to the scope of rights of the present invention.

What is claimed is:

1. A printed circuit board having a strip line, comprising:
    a first insulation layer,
    a signal line being buried in one surface of the first insulation layer;
    a plurality of conductors penetrating through the first insulation layer and being disposed on both sides of the signal line in parallel with the signal line;
    a ground layer formed on the other surface of the insulation layer such that the ground layer is electrically connected to the plurality of conductors;
    a second insulation layer formed on the one surface of the first insulation layer such that the second insulation layer covers the signal line; and
    a power layer formed on the second insulation layer, wherein:
    the width of the signal line becomes narrower as the signal line extends toward the other surface of the first insulation layer,
    the width of each of the plurality of conductors becomes narrower as the plurality of conductors extend toward the one surface of the first insulation layer, and
    the signal line having sides thereof that face a corresponding side of each of the plurality of conductors in parallel.

2. The printed circuit board of claim 1, wherein the signal line includes a plurality of signal lines and the plurality of signal lines and the plurality of conductors are alternately disposed.

3. The printed circuit board of claim 1, wherein the signal line is constituted by a pair of unit signal lines, and the pair of unit signal lines is a differential pair.

4. The printed circuit board of claim 1, wherein a respective distance between the signal line and adjacent ones of the plurality of conductors is identical to one another.

* * * * *